(12) United States Patent
Callahan

(10) Patent No.: US 6,493,414 B1
(45) Date of Patent: Dec. 10, 2002

(54) DIE INFORMATION LOGIC AND PROTOCOL

(75) Inventor: John M. Callahan, San Ramon, CA (US)

(73) Assignee: Nanoamp Solutions, INC, San Jose, CA (US)

( * ) Notice: Subject to any disclaimer, the term of this patent is extended or adjusted under 35 U.S.C. 154(b) by 0 days.

(21) Appl. No.: 09/922,249

(22) Filed: Aug. 2, 2001

(51) Int. Cl.⁷ .................................................. G11C 19/00
(52) U.S. Cl. ............................ 377/69; 377/77; 377/78; 377/80; 326/16; 326/46; 326/113; 327/525; 714/724; 714/725
(58) Field of Search ........................... 326/16, 113, 46; 327/525; 377/69, 77, 78, 80

(56) References Cited

U.S. PATENT DOCUMENTS

| | | | | |
|---|---|---|---|---|
| 3,829,713 A | * | 8/1974 | Canning | 307/225 C |
| 5,572,536 A | * | 11/1996 | Thiruvengadam | 371/22.4 |
| 6,301,322 B1 | * | 10/2000 | Manning | 377/54 |
| 6,346,822 B2 | * | 2/2002 | Nishikawa | 326/16 |

* cited by examiner

Primary Examiner—Michael Tokar
Assistant Examiner—Vibol Tan
(74) Attorney, Agent, or Firm—Patrick T. King

(57) ABSTRACT

An on-chip parallel/load, serial-shift shift register stores information bits for one or more chip parameters. The bits are represented by fuses that are connected to respective input terminals of the shift register. When the chip is not in test mode (TM), the fuses are electrically connected to respective cells of the shift register, and the output of the shift register is electrically isolated from an output buffer. When the chip is put into test mode, the electrical connections between the fuses and the shift register bits are broken, leaving the fuse information isolated in the shift register. The test mode also connects the output of the shift register to the output buffer and the output of the first shift register bit is seen on the output pin. The rest of the shift register information bits are serially shifted out of the shift register by toggling the CEB pin. When not in the test mode an output terminal of a memory array that stores normal data in the integrated-circuit chip is connected to the output buffer.

3 Claims, 10 Drawing Sheets

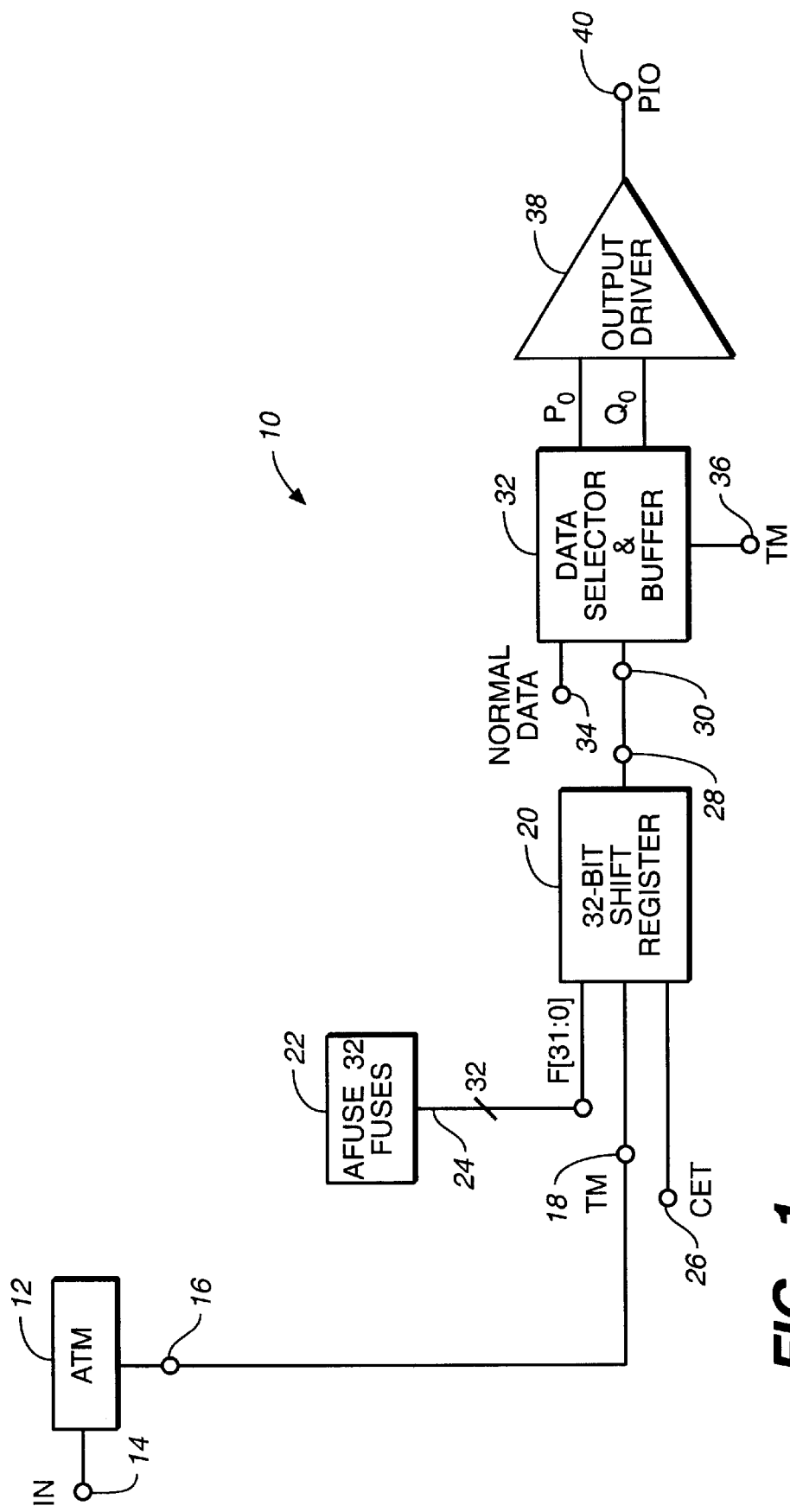
FIG._1

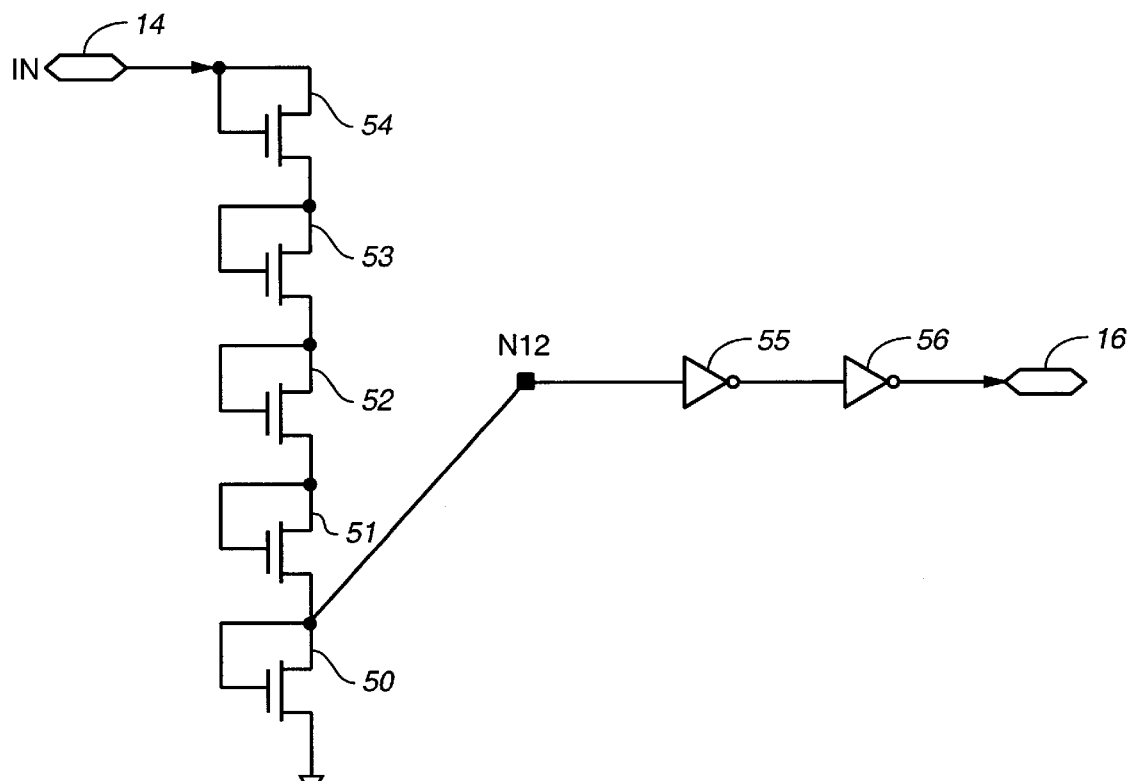
FIG._2
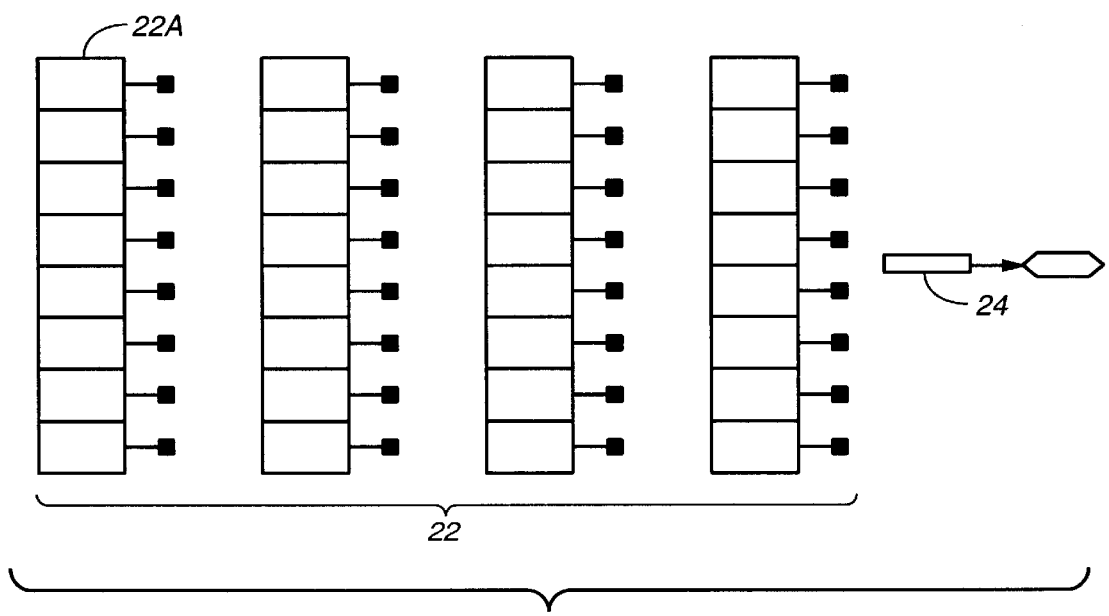
FIG._3

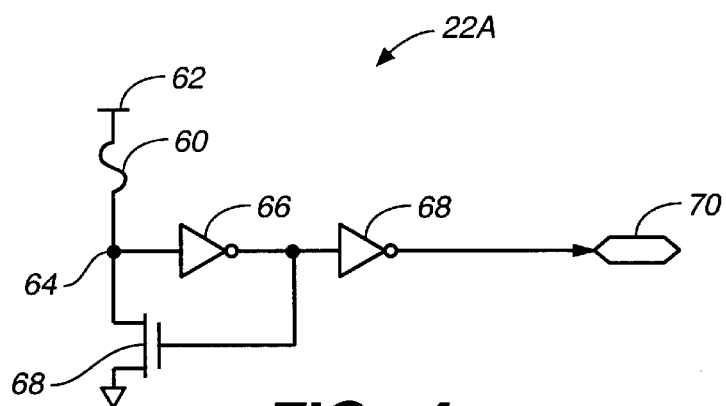
FIG._4
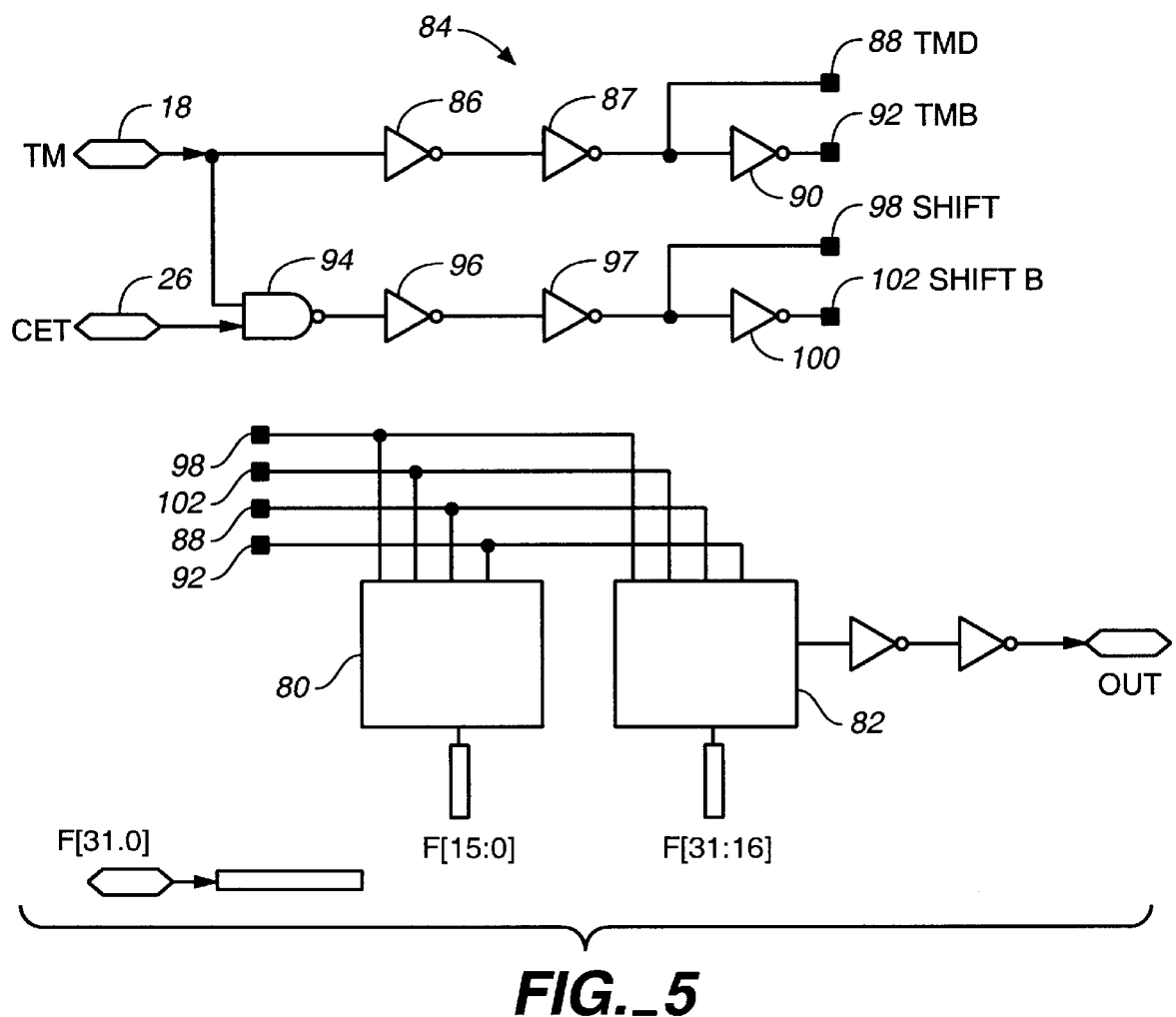
FIG._5

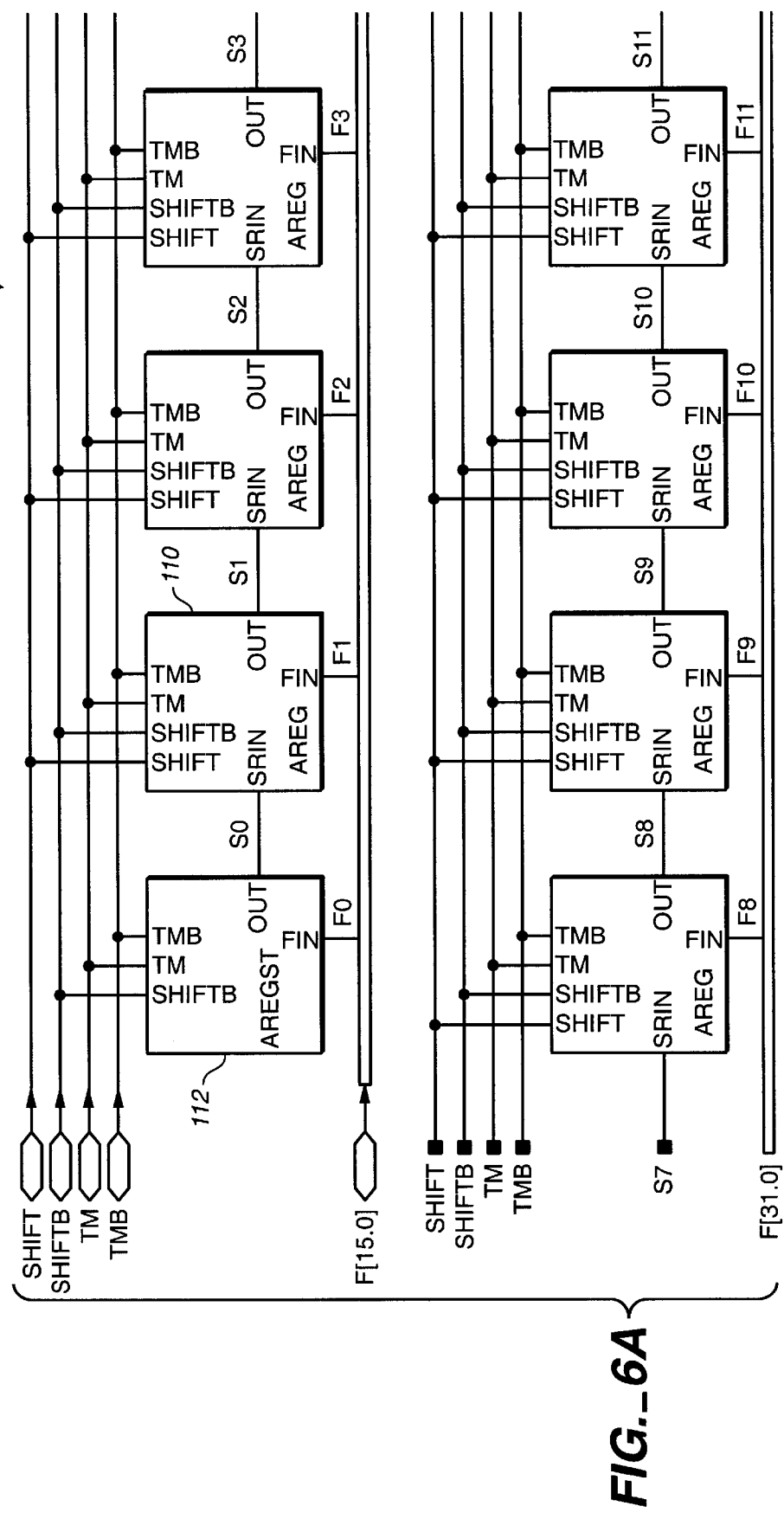
FIG._6A
FIG._6 | FIG._6A | FIG._6B
FIG._6

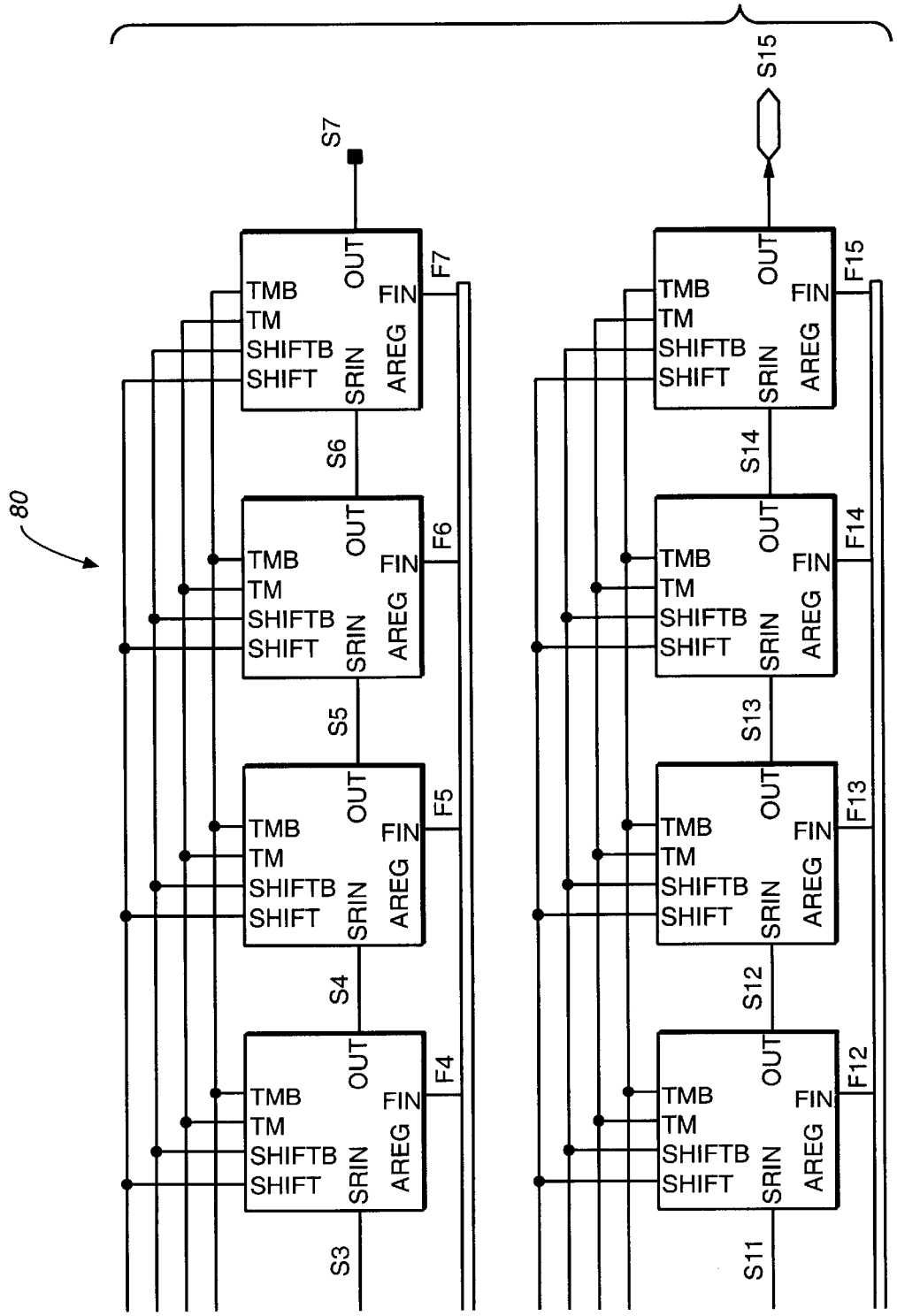
FIG._6B

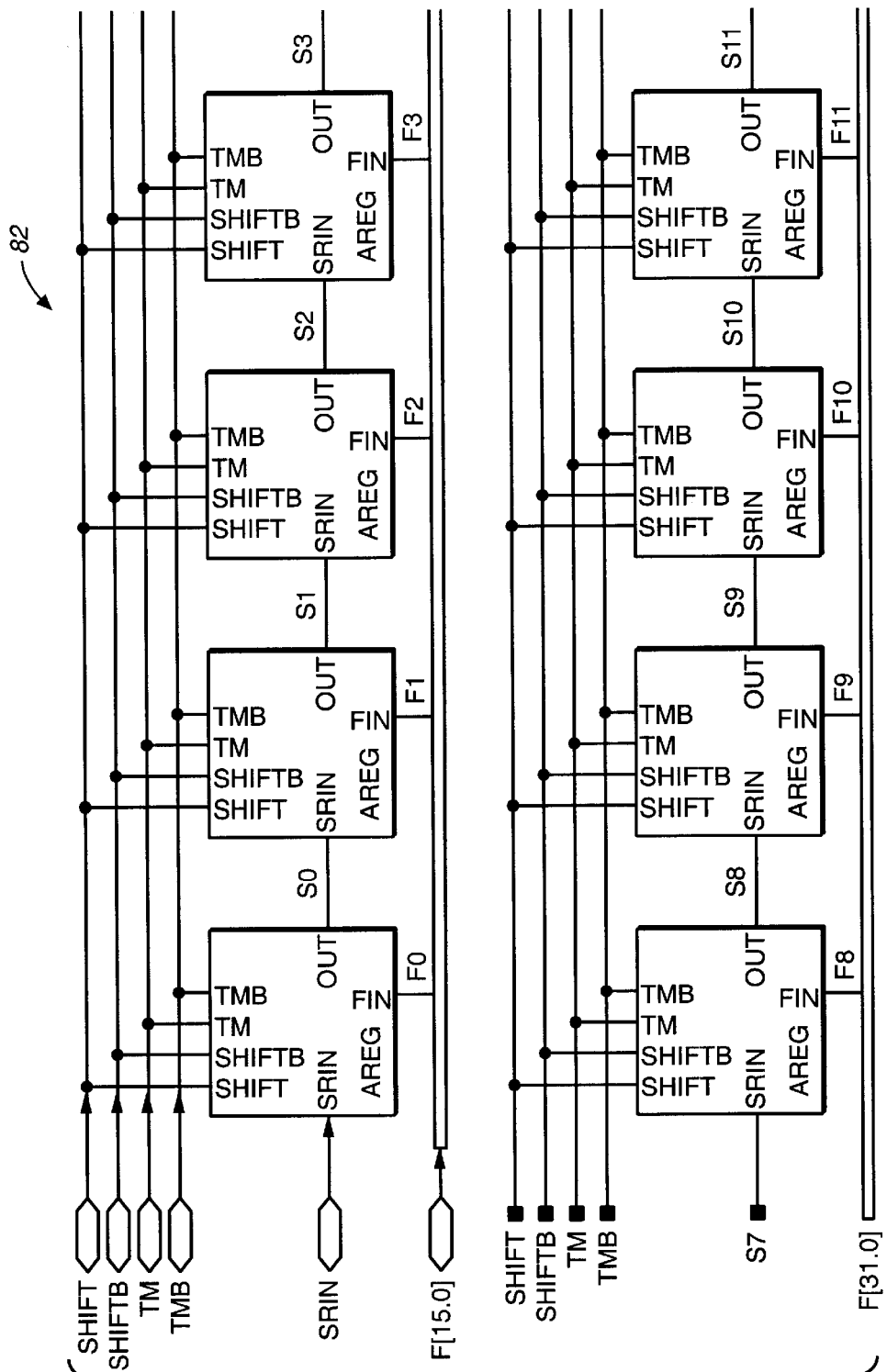

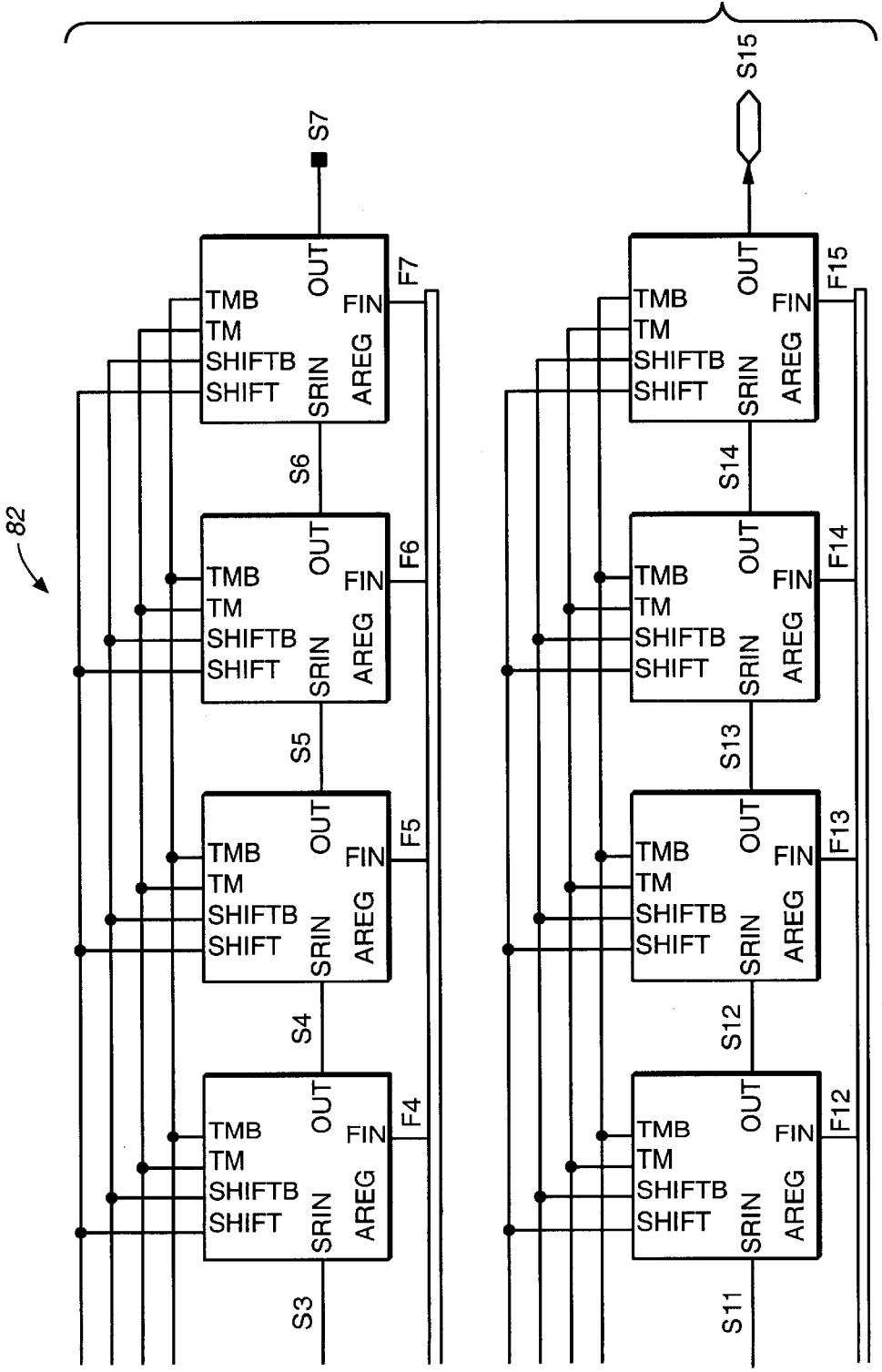

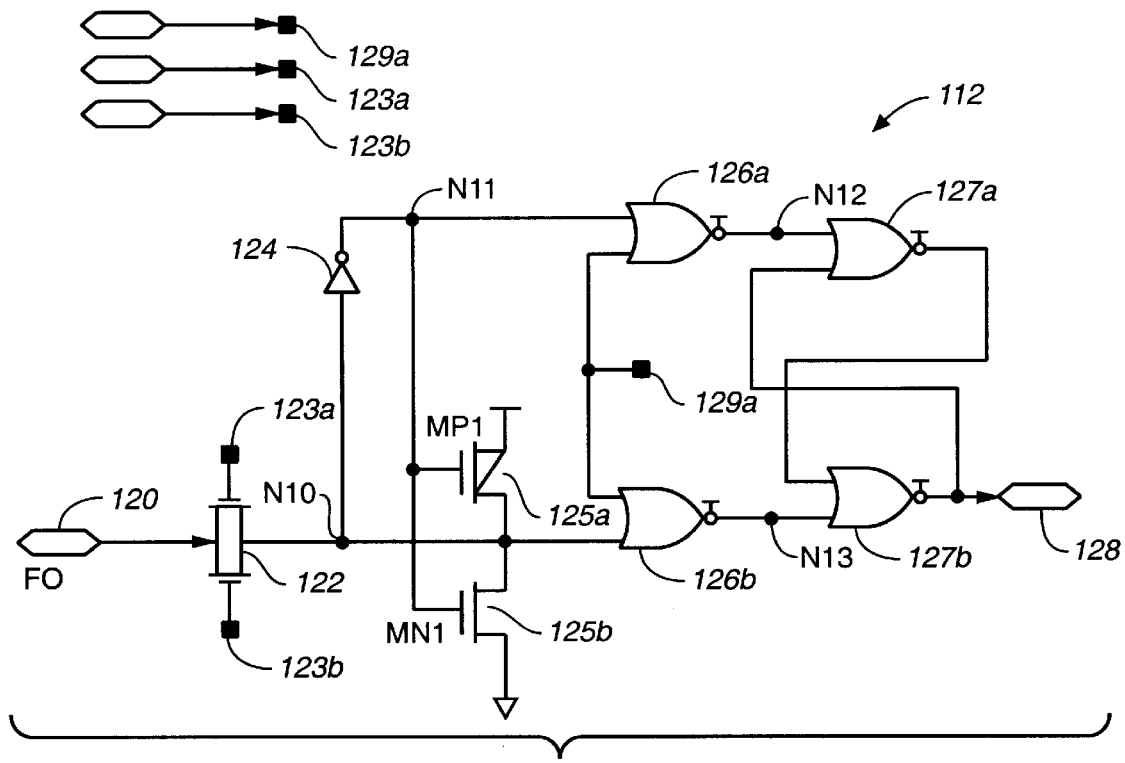
*FIG._8*
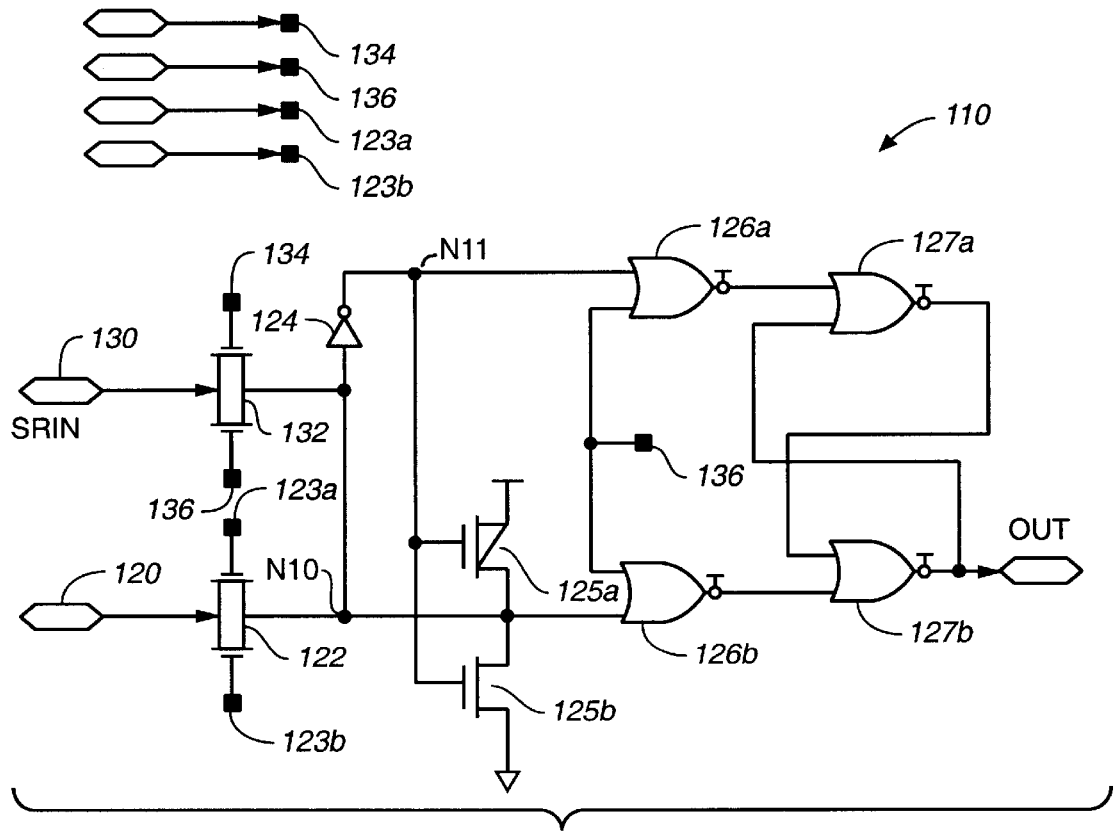
*FIG._9*

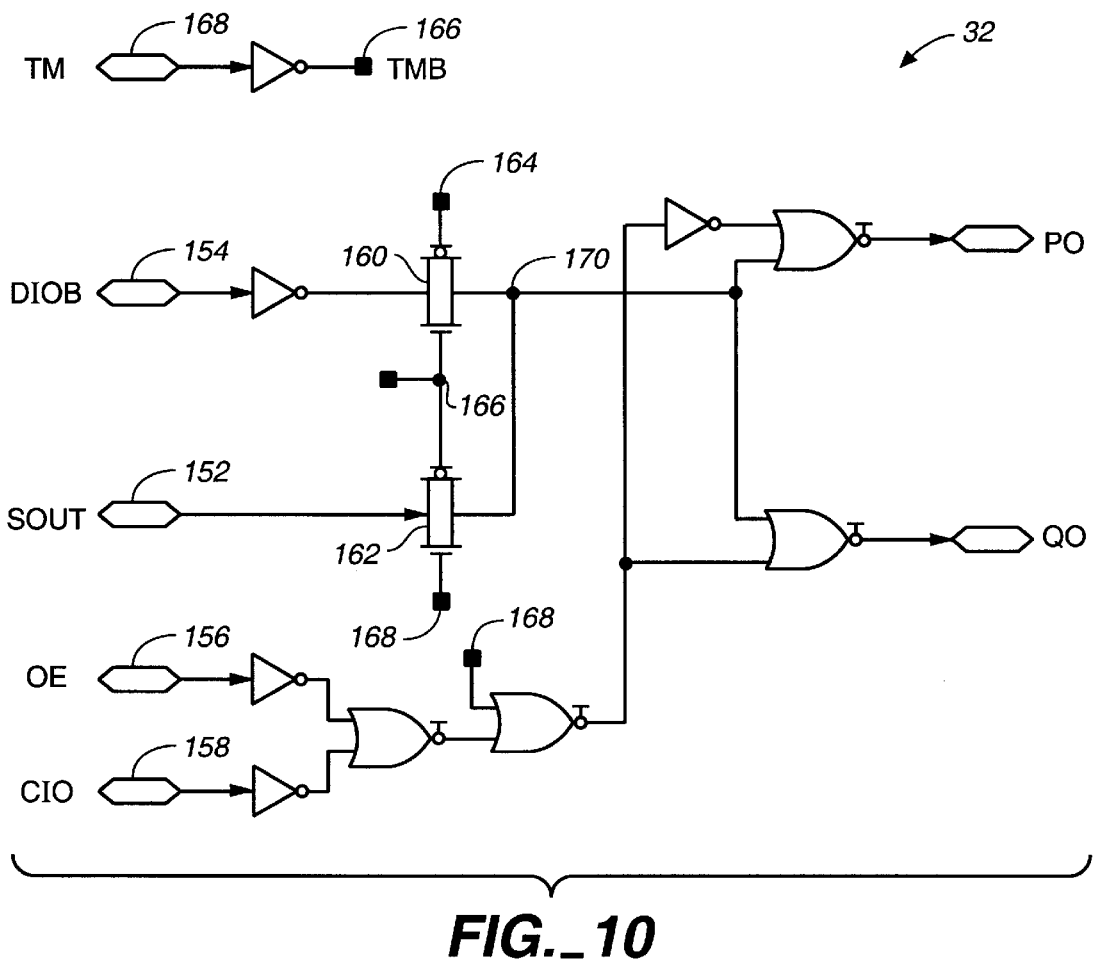
FIG._10

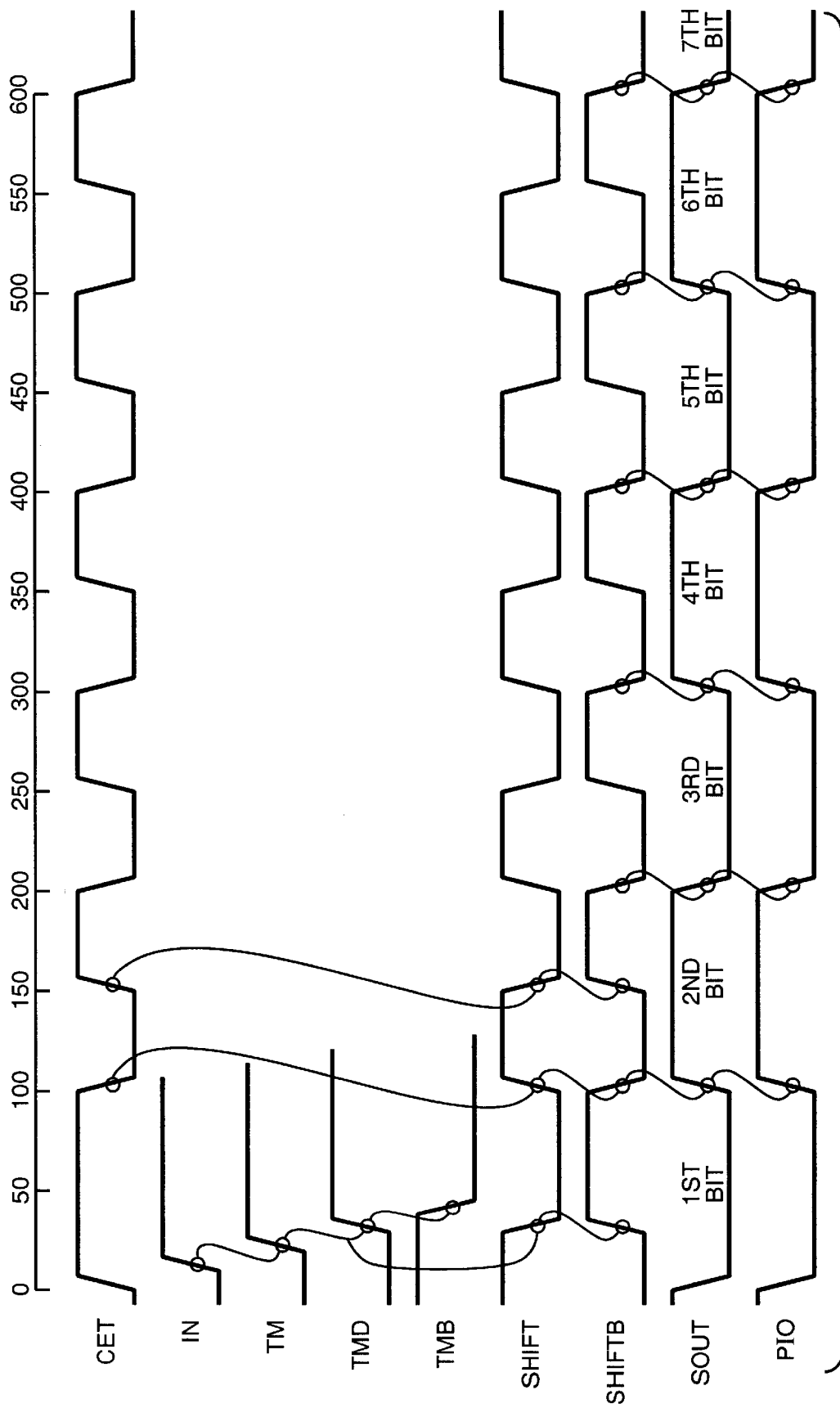
FIG._11

DIE INFORMATION LOGIC AND PROTOCOL

BACKGROUND OF THE INVENTION

1. Field of the Invention

This invention relates to techniques for providing various information parameters stored on an integrated circuit die.

2. Prior Art

Certain information is of great assistance to process/design engineers for enhancing performance of an integrated-circuit manufacturing process. This information includes various parameters for a particular die or a packaged part. These parameters include, but are not limited to, the following: lot number; wafer number; wafer row number; wafer column number; row fuse number blown for redundancy, if any; column fuse number blown for redundancy, if any; etc. A need exists for a technique for storing various parameters to assist process and design engineers in improving a particular fabrication process.

SUMMARY OF THE INVENTION

It is therefore an object of the invention to provide a system and a method for storing and presenting various parameters related to an integrated-circuit chip.

A number of fuses are connected through electrical links provided by a CMOS transmission gate to respective input terminals of a multi-bit serial shift register. The output of the serial shift register is connected through a multiplexer to an output buffer. When the chip is not in test mode (TM=0), the fuses are electrically connected to respective input terminals of the shift register, and the output of the serial shift register is electrically isolated from the output buffer.

When the chip is in test mode, the electrical links between the fuses and the shift register bits are open leaving the fuse information isolated in the shift register. The test mode also connects the output of the shift register to the output buffer through the multiplexer so the output of the first shift register cell is provided on the output pin of the output buffer. The rest of the shift register information is serially shifted out by toggling a CET pin with thirty one negative edges of a positive-logic CET signal.

The present invention is for a system and method that provides a serial bit sequence that represents one or more information parameters stored in an integrated-circuit chip. The system includes a plurality of fuse modules, each having a fuse that is blown or not blown to represent a respective bit of the serial bit sequence at an output terminal of each fuse module. A parallel-load/serial-shift shift-register has a number of serially-connectable bit storage cells and a shift-register output terminal. Each bit storage cell has a bit-cell data input terminal and a bit-cell data output terminal. Each bit cell stores a respective bit of the serial bit sequence provided by a fuse module.

Each of the bit storage cells has a respective fuse-input transmission gate that has an input terminal coupled to an output terminal of a respective one of the plurality of fuse modules. Each of the bit storage cells also has an output terminal coupled to a an input terminal of an adjacent bit storage cell. The fuse-input transmission gate is controlled by a TEST MODE (TM) signal to provide parallel loading of the bit storage cells of the shift register with the bits of the bit sequence from the fuse modules.

Assume that the bits of the shift register are stored so that higher-ordered bits are first shifted out of the register. Each of the bit storage cells, except for the starting shift register bit cell, also has a serial-data transmission gate that has an input terminal coupled to an output terminal of an adjacent lower-order one-bit storage cell and that has an output terminal coupled to a respective bit storage cell data input terminal of a higher-order bit storage cell. The respective transmission gates are controlled by a SHIFT signal to serially connect the bit storage cells together to provide for serially shifting data through adjacent cells of the shift register to the output terminal of the shift register.

A two-input data selector and buffer has a first input terminal, a second input terminal, and an output terminal. The first input terminal is coupled to an output terminal of a memory array for storing normal-data in the integrated-circuit chip. The second input terminal is coupled to the data output terminal of the parallel-load/serial-shift shift-register. The two-input data selector and buffer has a control terminal that controls connection between the multiplexer output terminal and either the first input terminal or the second input terminal.

The system in a test mode has the respective fuse-input transmission gates off, the respective serial-data transmission gates on, and the two-input data selector and buffer provides data at its output terminal from the shift-register.

The system in a non-test mode has the respective fuse-input transmission gates on, the respective serial-data transmission gates are off, and the two-input data selector and buffer provides normal data at its output terminal.

The present invention also includes a method for providing a serial bit sequence that represents one or more information parameters stored on an integrated-circuit chip. The method includes the steps of: storing each respective bit of the serial bit sequence in a respective ones of a plurality of fuse modules by blowing or not blowing a fuse in each of the plurality of fuse modules; connecting output terminals of the fuse modules to respective input terminals of one of a plurality of serially-connectable bit storage cells of a parallel-load/serial-shift shift-register; parallel loading through a fuse-input transmission gate respective ones of the bit storage cells of the shift register with a bit from a respective one of the fuses. Each of the bit storage cells has a respective fuse-input transmission gate that has an input terminal coupled to an output terminal of a respective one of the plurality of fuse modules and that has an output terminal coupled to a respective bit storage cell data input terminal, wherein the serial data transmission gate provides for serially shifting data through an adjacent cell of the shift register to the output terminal of the shift register. Each of the bit storage cells, except for the starting shift register bit cell, also has a serial-data transmission gate that has an input terminal coupled to an output terminal of an adjacent lower-order one-bit storage cell and that has an output terminal coupled to a respective bit storage cell data input terminal of a higher-order bit storage cell, wherein the respective transmission gates serially connect the bit storage cells to provide for serially shifting data through adjacent cell of the shift register to the output terminal of the shift register.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a system block diagram that illustrates a system for serially providing a bit sequence that represents one or more information parameters stored in an integrated-circuit chip.

FIG. 2 is a circuit diagram for a circuit that senses an INPUT signal and that provides a test mode control signal TM for putting the integrated-circuit chip into a test mode.

FIG. 3 is a block diagram that shows 32 fuse modules for a 32-bit parameter sequence.

FIG. 4 is a circuit diagram of an individual fuse circuit of a fuse module.

FIG. 5 is a block diagram that shows two 16-bit shift registers that are combined to provide a 32-bit shift register and that also shows a circuit diagram for generating control signals for the 32-bit shift register.

FIG. 6 is a block diagram of the first 16-bit shift register showing a starting register cell AREGST and fifteen normal register bit cells AREG.

FIG. 7 is a block diagram of the second 16-bit shift register showing sixteen normal register bit cells AREG.

FIG. 8 is a circuit diagram of the starting shift register bit cell AREGST.

FIG. 9 is a circuit diagram of the normal shift register bit cell AREG.

FIG. 10 is a circuit diagram of a system output multiplexer that selects data from the 32-bit shift register or from a memory array for storing normal-data in the integrated-circuit chip.

FIG. 11 is a timing diagram for the system.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

FIG. 1 illustrates a system 10 for serially providing a bit sequence that represents one or more information parameters stored in an integrated-circuit chip. Certain kinds of information are of great assistance to process/design engineers for determining process performance. Such information includes various parameters for a particular die or a packaged part. These parameters include, but are not limited to, the following: lot number; wafer number; wafer row number; wafer column number; row fuse number blown for redundancy, if any; column fuse number blown for redundancy, if any; etc. This information is used for investigation and analysis of the fabrication process for a wafer.

A test mode sensor circuit 12 senses an IN signal at a test mode pad 14 and provides a test mode control signal TM at an output 16 terminal to put the system 10 into a test mode. The TM control signal is connected to an input terminal 18 of a 32-bit shift register 20.

An AFUSE32 module 22 contains 32 fuse circuits, the output terminals of which are connected through a 32-bit bus 24 to input terminals of individual register cells in the 32-bit shift register 20 for parallel loading of the 32-bit shift register 20. Each fuse circuit provides a fuse signal Fn, where n=0 to 31. A chip-enable signal CET is provided at a terminal 26. CET is an inverted conventional CEB signal. CET is an active HIGH signal. The CET pin 26 is used for serially shifting data through the shift register 20 by toggling the CET pin 26 with thirty one negative edges of a CET signal.

An output terminal 28 of the 32-bit shift register 20 is connected to one input terminal 30 of a two-input data selector and buffer 32. Another input terminal 34 of the two-input data selector and buffer 32 is adapted to be coupled to an output terminal of a memory array that stores normal-data in the integrated-circuit chip. The TM signal is provided at a control terminal 36 of the two-input data selector and buffer 32 to select either the data stored in the 32-bit shift register or normal data stored in a normal memory array of the integrated-circuit chip. The two-input data selector and buffer 32 has Po, Qo that are complementary only when disabled (Oe=0), otherwise they toggle together (Po=Qo and Po=Qo=1). Po, Qo are input signals to an output driver 38 having an output terminal 40.

FIG. 2 is a more detailed circuit diagram for the test mode sensor circuit 12 that senses an IN signal at the test mode pad 14 and that provides the test mode control signal TM on the signal line 16 for putting the system 10 into a test mode. The test mode sensor circuit 12 includes five serially connected NMOS transistors 50–54, each of which have its gate and drain terminals connected together. The serial connection of the five NMOS transistors is provided by the gate and drain terminals of a lower NMOS transistor being connected to the source terminal of a higher NMOS transistor 5, as illustrated. The source terminals of NMOS transistor 50 is connected to ground. The gate and drain terminals of the lowest NMOS transistor 50 at a node N12 is connected to an input terminal of an inverter pair 55, 56. The TM signal is provided at output terminal 16 when the IN signal at the test mode pad 14 is connected to 7.5 volts. The voltage level at node N12 goes high to provide a high level for signal TM at output terminal 16, which put the chip into a test mode.

FIG. 3 shows an AFUSE32 module 22 which is a group 60 of thirty two identical, individual fuse modules, typically identified as 22a. Each of these fuse modules stores a respective bit of a 32-bit parameter sequence. The output terminals of the fuse modules are connected to a 32-bit bus 24 to input terminals of individual register cells in the 32-bit shift register 20 for parallel loading of the 32-bit shift register 20 with the fuse modules signals F[31:0].

FIG. 4 shows a typical fuse module 22a. A fuse element 60 is connected between a terminal 62 of a positive voltage source and a node 64. Node 64 is connected to an input terminal of an inverter 66. Node 64 is also connected to a drain terminal of a NMOS transistor that has a source terminal connected to ground and a gate terminal connected to an output terminal of the inverter 66. The output terminal of the inverter 66 is connected to an input terminal of another inverter 68 that has an output terminal 70 at which is provided one of the fuse output signals F[31:0].

FIG. 5 shows the 32-bit shift register that is provided with two 16-bit shift registers 80, 82. FIG. 5 also shows a control signal generating circuit 84 for generating various control signals for controlling operation of the 32-bit shift register.

The TM control signal is connected to an input terminal 18 of the 32-bit shift register 20. A chip-enable signal CET is provided at a terminal 26. The input terminal 18 for the TM control signal is connected to a pair of inverters 86, 87 that provide a delayed TM control signal TMD at an output terminal 88. An inverter 90 provides an inverted delayed TM control signal TMB at a terminal 92.

The TM control signal and the CET control signal a logically combined in a 2-input NAND gate. An output terminal of the 2-input NAND gate is connected through another pair of inverters 96, 97 to an output terminal 98, at which is provided an active-low SHIFT control signal. An inverted SHIFT control signal SHIFTB is provided through another inverter 100 to a SHIFTB output terminal 102.

The TMD, TMB, SHIFT, and SHIFTB control signals are connected to corresponding control signal terminals of two 16-bit shift registers 80, 82. Data is serially shifted through the shift register by toggling the CET pin 26 with thirty one negative edges of a CET signal. When the TM signal is inactive, the shift registers 80, 82 receive the fuse module signals F[31:0].

FIGS. 6 and 7 show two 16-bit shift registers. Thirty-one of the registers of the two 16-bit registers are the same, as indicated by a typical AREG register 110. A starting AREGST register cell 112 in FIG. 7 has somewhat different configuration because it is the last register in a serial string and does not have data shifted into it from another register.

FIG. 8 is a circuit diagram of the starting shift register bit cell AREGST 112. For the embodiment of the invention described herein, the starting shift register bit cell AREGST 112 contains the lowest order bit of the serial bit sequence. An input signal F0, which is the lowest order bit of the fuse signals F[31:0], is provided at an input terminal 120. A CMOS fuse-input transmission gate 122 has a TM signal applied to the PMOS device of the transmission gate 122 and a TMB signal applied to the NMOS device of the transmission gate 122. When the chip is not in test mode, the TM signal is not active so that TM=0 and TMB=Vcc so that the CMOS fuse-input transmission gate 122 is open to pass the F0 signal to a node N10 and through an inverter 124 to a node N11.

A PMOS transistor MP1 and an NMOS transistor MN1 are high resistance transistors that are combined to form a high impedance holding latch for the voltage on node N10 when the transmission gate 122 is closed. A high voltage at node N10 puts a low voltage on node N11 that turns on the PMOS transistor 125a and turns off the NMOS transistor 125b, which holds a high voltage at node N10 if the transmission gate 122 is closed. A low voltage at node N10 puts a high voltage on node N11 that turns off PMOS transistor 125A and turns on NMOS transistor 125b, which holds a low voltage at node N10.when the transmission gate 122 is closed.

An R/S flip flop circuit is formed with two 2-input NOR gates 126a, 126b and two cross-coupled 2-input NOR gates 127a, 127b, with respective input nodes N12 and N13. SHIFTB is applied to 129A. TM is applied to 123a. TMB is applied to 123b. When the inverted SHIFTB signal is high, the data signals at nodes N10 and node N11 are connected to respective nodes N12, N13. When SHIFTB=VSS, the output at an output terminal 128 reflects the voltage on N10, or FIN.

FIG. 9 is a circuit diagram of the typical shift register bit cell AREG 110. This cell is the same as the starting cell 112 of FIG. 8, but with a SRIN input signal provided at a terminal 130. Signals SHIFT, SHIFTB, TM, nd TMB are applied to 134, 136, 123a, and 123b respectively.

FIG. 10 illustrates a two-input data selector and buffer 32 that is used to select data from either the 32-bit shift register or from a standard memory array that stores normal-data in the integrated-circuit chip. The serial output signal SOUT from the 32-bit shift register is provided at an input terminal 152. The output signal DIOB from a standard memory array is provided at an input terminal 154. An output enable signal OE is provided at an input terminal 156.

The two-input data selector and buffer 32 includes a pair of oppositely phased CMOS transmission gates 160, 162. The CMOS transmission gate 160 has a PMOS gate terminal 164 to which is applied the TM control signal. The CMOS transmission gate 160 also has an NMOS gate terminal 166 to which is applied the inverted TMB signal from a terminal 166. The CMOS transmission gate 162 has a NMOS gate terminal 168 to which is applied the TM control signal. The CMOS transmission gate 162 also has a PMOS gate terminal 166 to which is applied the inverted TMB signal from a terminal 166. The output terminals of the CMOS transmission gates 160, 162 are connected together at a DATA terminal 170.

When the chip is not enabled, OE=VSS. That is why TM is involved with the OEB signal. TM=VCC keeps the output buffer enabled when OE=VSS. CIO is a bonding option signal that is hooked to VCC for this output buffer.

When TM=VCC, DIOB is isolated from node 170, and SOUT is connected to node 170.

FIG. 11 is a timing diagram for the system showing signals such as CET, IN, TM TMD, TMB, SHIFT, SHIFTB, SOUT and PIO. In operation, a 7.5 volt IN signal is applied to the test mode pad 14 of FIG. 1 produces the delayed test mode signal and the inverted delayed test mode signal at terminals 88 and 92 of FIG. 5. When active, these test mode signals TMD and TMB turn off the fuse-input transmission gates 122 in FIGS. 8 and 9. For the two input data selector and buffer 32 of FIG. 10, TM and TMB turn off the CMOS transmission gate 160 for the output signal DIOB is received from a standard memory array provided at an input terminal 154. TM and TMB also turn on the CMOS gate 162 for the serial output signal SOUT provided at an input terminal 152 of FIG. 10 from the 32-bit shift register 20.

The TM signal and the CET signal are logically combined in FIG. 5 to provide a SHIFT control signal and an inverted SHIFT control signal SHIFTB. The SHIFT signal is used in the cells of FIGS. 8 and 9 to shift data through the 32-bit shift register 20. The SOUT output initially is the first bit in the register. Additional bits are serially shifted out of the register when the SHIFTB signal goes to LOW level.

When the chip is put into test mode, the electrical link between the fuses and the shift register bits is broken leaving the fuse information isolated in the shift register. Test mode also hooks the output of the shift register to the output buffer through the mux. The output of the first shift register bit is seen on the output pin. The rest of the shift register information is brought out by toggling the CEB pin. Each shift register bit information is seen on each subsequent CEB negative edge. Thirty-one negative edges of the CEB signal serially shift out the information in the shift register.

When the chip goes out of test mode, the fuse information is loaded back into the shift register cells, restoring the original information from the fuses, no matter what the remaining contents of the shift register. To go out of test mode, the test mode pad is put to 3.6 volts or lower.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A system for providing a serial bit sequence that represents one or more information parameters stored in an integrated-circuit chip, comprising:

a plurality of fuse modules, wherein each fuse module has a fuse that is blown or not blown to represent a respective bit of the serial bit sequence at an output terminal thereof;

a parallel-load/serial-shift shift-register that has a shift-register output terminal and that has a number of serially-connectable bit storage cells, wherein each bit storage cell stores a respective bit of the serial bit sequence, wherein each of said serially-connected bit storage cells has a bit-cell data input terminal and a bit-cell data output terminal;

wherein each of said bit storage cells has a respective fuse-input transmission gate that has an input terminal coupled to an output terminal of a respective one of the plurality of fuse modules and that has an output terminal coupled to a respective bit storage cell data input terminal, wherein the fuse-input transmission gate is controlled by a TEST MODE signal to provide parallel loading of the bit storage cells of the shift register with the bits of the bit sequence;

each of said bit storage cells, except for the starting shift register bit cell, also has a serial-data transmission gate that has an input terminal coupled to an output terminal of an adjacent lower-order one-bit storage cell and that has an output terminal coupled to a respective bit storage cell data input terminal of a higher-order bit storage cell, wherein the respective transmission gates are controlled by a SHIFT signal to serially connect the bit storage cells together to provide for serially shifting data through adjacent cells of the shift register to the output terminal of the shift register;

a two-input data selector and buffer having first and second input terminals and an output terminal, wherein the first input terminal is coupled to an output terminal of a memory array for storing normal-data in the integrated-circuit chip, wherein the second input terminal is coupled to the data output terminal of the parallel-load/serial-shift shift-register;

wherein the system in a TEST MODE has the respective fuse-input transmission gates turned off, the respective serial-data transmission gates are on, and the two-input data selector and buffer provides data at its output terminal from the shift-register; and wherein the system in a non-TEST MODE has the respective fuse-input transmission gates on, the respective serial-data transmission gates are off, and the two-input data selector and buffer provides normal data at its output terminal.

2. The system of claim 1 wherein the two-input data selector and buffer includes a first CMOS transmission gate and a second oppositely phased CMOS transmission gate that have their output terminals connected together to an input terminal of an output driver circuit;

wherein an input terminal of the first CMOS transmission gate is connected to an output terminal of the memory array for storing normal-data in the integrated-circuit chip and wherein the second input terminal is coupled to the data output terminal of the parallel-load/serial-shift shift-register, and wherein the two-input data selector and buffer provides alternate connections between the output terminal of the two-input data selector and buffer and either one of the first input terminal or the second input terminal.

3. A method for providing a serial bit sequence that represents one or more information parameters stored on an integrated-circuit chip, comprising the steps of:

storing each respective bit of the serial bit sequence in a respective ones of a plurality of fuse modules by blowing or not blowing a fuse in each of the plurality of fuse modules;

connecting output terminals of the fuse modules to respective input terminals of one of a plurality of serially-connectable bit storage cells of a parallel-load/serial-shift shift-register;

parallel loading through a fuse-input transmission gate respective ones of the bit storage cells of the shift register with a bit from a respective one of the bit storage cells;

wherein each of said bit storage cells has a respective fuse-input transmission gate that has an input terminal coupled to an output terminal of a respective one of the plurality of fuse modules and that has an output terminal coupled to a respective bit storage cell data input terminal;

each of said bit storage cells, except for the starting shift register bit cell, also has a serial-data transmission gate that has an input terminal coupled to an output terminal of an adjacent LOWER-ORDER one-bit storage cell and that has an output terminal coupled to a respective bit storage cell data input terminal of a HIGHER-ORDER bit storage cell, wherein the respective transmission gates serially connect the bit storage cells to provide for serially shifting data through adjacent cell of the shift register to the output terminal of the shift register; and selecting either normal-data from a memory array in the integrated-circuit chip or data from the data output terminal of the parallel-load/serial-shift shift-register.

* * * * *